United States Patent
Ikeda

(10) Patent No.: US 9,123,536 B2
(45) Date of Patent: Sep. 1, 2015

(54) SEMICONDUCTOR DEVICE

(71) Applicant: Kabushiki Kaisha Toshiba, Minato-ku (JP)

(72) Inventor: Kentaro Ikeda, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/183,698

(22) Filed: Feb. 19, 2014

(65) Prior Publication Data

US 2014/0284655 A1 Sep. 25, 2014

(30) Foreign Application Priority Data

Mar. 21, 2013 (JP) ................. 2013-058840

(51) Int. Cl.
| | |
|---|---|
| *H01L 25/18* | (2006.01) |
| *H01L 27/02* | (2006.01) |
| *H01L 27/085* | (2006.01) |
| *H03K 17/567* | (2006.01) |
| *H01L 27/06* | (2006.01) |

(52) U.S. Cl.
CPC ............ *H01L 27/0255* (2013.01); *H01L 25/18* (2013.01); *H01L 27/0266* (2013.01); *H03K 17/567* (2013.01); *H01L 27/0629* (2013.01); *H01L 27/085* (2013.01); *H01L 2224/48137* (2013.01); *H01L 2224/48247* (2013.01); *H01L 2224/48464* (2013.01); *H01L 2224/49171* (2013.01); *H01L 2924/12032* (2013.01); *H01L 2924/13091* (2013.01)

(58) Field of Classification Search
CPC ..... H01L 25/18; H01L 27/02; H01L 27/0255; H01L 27/085
See application file for complete search history.

(56) References Cited

U.S. PATENT DOCUMENTS

| | | | |
|---|---|---|---|
| 8,896,131 B2 * | 11/2014 | Bhalla et al. .................. | 257/777 |
| 2007/0243668 A1 | 10/2007 | Sankin et al. | |
| 2009/0201072 A1 | 8/2009 | Honea et al. | |
| 2011/0169549 A1 | 7/2011 | Wu | |
| 2011/0181252 A1 | 7/2011 | Salato et al. | |

(Continued)

FOREIGN PATENT DOCUMENTS

| | | |
|---|---|---|
| DE | 10157250 C1 | 12/2002 |
| EP | 2 511 952 A1 | 10/2012 |

(Continued)

OTHER PUBLICATIONS

Extended Search Report issued Oct. 14, 2014 in European Patent Application No. 14155485.7.

Wataru Saito, et al., "Switching Controllability of High Voltage GaN-HEMTs and the Cascode Connection", Proceedings of the 2012 24th International Symposium on Power Semiconductor Devices and ICs, IEEE, XP32452808A, Jun. 3-7, 2012, pp. 229-232.

(Continued)

*Primary Examiner* — Minh-Loan Tran
*Assistant Examiner* — Fazli Erdem
(74) *Attorney, Agent, or Firm* — Oblon, McClelland, Maier & Neustadt, L.L.P.

(57) ABSTRACT

A semiconductor device of an embodiment is provided with a normally-off transistor having a first source connected to a source terminal, a first drain, and a first gate connected to a gate terminal and a normally-on transistor having a second source connected to the first drain, a second drain connected to a drain terminal, and a second gate connected to the source terminal. A withstand voltage between the first source and the first drain when the normally-off transistor is turned off is lower than a withstand voltage between the second source and the second gate of the normally-on transistor.

11 Claims, 8 Drawing Sheets

(56) References Cited

U.S. PATENT DOCUMENTS

| | | | |
|---|---|---|---|
| 2011/0227095 A1* | 9/2011 | Treu et al. | 257/77 |
| 2012/0241756 A1* | 9/2012 | Zhang et al. | 257/76 |
| 2012/0262220 A1* | 10/2012 | Springett | 327/430 |
| 2013/0088280 A1* | 4/2013 | Lal et al. | 327/513 |
| 2013/0264654 A1* | 10/2013 | Weis et al. | 257/392 |
| 2014/0029152 A1* | 1/2014 | Mazzola et al. | 361/115 |
| 2014/0284662 A1* | 9/2014 | Ikeda | 257/195 |
| 2014/0346570 A1* | 11/2014 | Ueno | 257/195 |
| 2014/0374801 A1* | 12/2014 | Ikeda | 257/195 |
| 2014/0375372 A1* | 12/2014 | Ikeda | 327/333 |
| 2015/0043116 A1* | 2/2015 | Weyers et al. | 361/91.5 |

FOREIGN PATENT DOCUMENTS

| | | |
|---|---|---|
| EP | 2 511 953 A1 | 10/2012 |
| FR | 2678772 A1 | 1/1993 |
| JP | 2006-324839 A | 11/2006 |
| JP | 2012-212875 | 11/2012 |

OTHER PUBLICATIONS

Search Report issued Feb. 23, 2015 in European Patent Application No. 14155485.7 (in English).

* cited by examiner

SEMICONDUCTOR DEVICE

CROSS-REFERENCE TO RELATED APPLICATION

This application is based upon and claims the benefit of priority from Japanese Patent Application No. 2013-058840, filed on Mar. 21, 2013, the entire contents of which are incorporated herein by reference.

FIELD

Embodiments described herein relate generally to a semiconductor device.

BACKGROUND

A group-III nitride semiconductor, for example, a GaN (gallium nitride)-based semiconductor is expected as a material of a next-generation power semiconductor device. A GaN-based semiconductor device has a band gap wider than that of a Si (silicon) semiconductor and this may realize higher withstand voltage and lower loss than those of the Si semiconductor device.

In a GaN-based transistor, a HEMT (high electron mobility transistor) structure using two-dimensional electron gas (2DEG) as a carrier is provided in general. A normal HEMT is a normally-on transistor conducting even when a voltage is not applied to a gate. Therefore, there is a problem that it is difficult to realize a normally-off transistor conducting only when the voltage is applied to the gate.

In a power source circuit and the like handling a large amount of power of several hundreds to one thousand volts, normally-off operation is required with emphasis on safety. Therefore, a circuit configuration to realize the normally-off operation by cascode connection of a normally-on GaN-based transistor and a normally-off Si transistor is proposed.

However, in such circuit configuration, there is a problem of a break and deterioration in property of a device when an overvoltage is generated at a connection between the two transistors.

DETAILED DESCRIPTION

Figure 1:
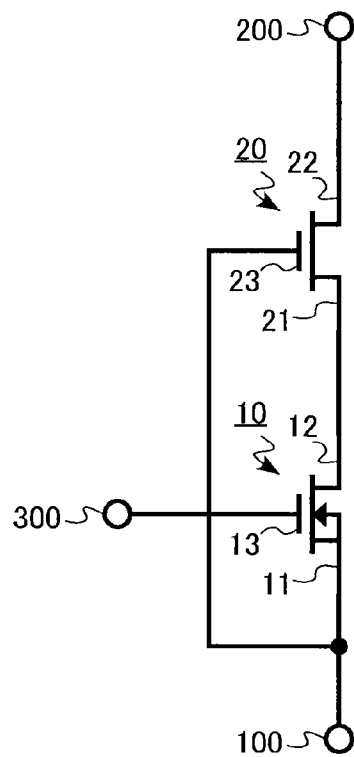
FIG. 1 is a circuit diagram of a semiconductor device of a first embodiment.

A semiconductor device of an embodiment is provided with a normally-off transistor including a first source connected to a source terminal, a first drain, and a first gate connected to a gate terminal and a normally-on transistor including a second source connected to the first drain, a second drain connected to a drain terminal, and a second gate connected to the source terminal. A withstand voltage between the first source and the first drain when the normally-off transistor is turned off is lower than a withstand voltage between the second source and the second gate of the normally-on transistor.

Hereinafter, embodiments of the disclosure are described with reference to the drawings. Meanwhile, in the following description, the same reference numeral is assigned to the same member and the like and the description of the member and the like once described is appropriately omitted.

In this specification, the semiconductor device is a concept including a power module in which a plurality of devices such as a discrete semiconductor are combined, an intelligent power module in which a driver circuit which drives the devices and a self-protection function are incorporated in a plurality of devices such as the discrete semiconductor, or an entire system provided with the power module and the intelligent power module.

First Embodiment

A semiconductor device of this embodiment is provided with a source terminal, a drain terminal, a gate terminal, a normally-off transistor including a first source connected to the source terminal, a first drain, and a first gate connected to the gate terminal, and a normally-on transistor including a second source connected to the first drain, a second drain connected to the drain terminal, and a second gate connected to the source terminal. A withstand voltage between the first source and the first drain when the normally-off transistor is turned off is lower than a withstand voltage between the second source and the second gate of the normally-on transistor.

FIG. 1 is a circuit diagram of the semiconductor device of this embodiment. The semiconductor device of this embodiment is a power module having a rated voltage of 600 V or 1200 V, for example.

In the semiconductor device of this embodiment, a normally-off transistor 10 and a normally-on transistor 20 are cascode connected to form the power module. The normally-off transistor 10 is a Si (silicon)-vertical MOSFET (metal oxide semiconductor field effect transistor), for example. The normally-on transistor 20 is a GaN (gallium nitride)-based HEMT, for example. The normally-on transistor 20 is provided with a gate insulation film.

Meanwhile, the normally-off transistor 10 includes a parasitic body diode not illustrated.

The normally-off transistor 10 has a device withstand voltage lower than that of the normally-on transistor 20. The device withstand voltage of the normally-off transistor 10 is 10 to 30 V, for example. The device withstand voltage of the normally-on transistor 20 is 600 to 1200 V, for example.

The semiconductor device is provided with a source terminal 100, a drain terminal 200, and a gate terminal 300. The normally-off transistor 10 includes a first source 11 connected to the source terminal 100, a first drain 12, and a first gate 13 connected to the gate terminal 300. The normally-on transistor 20 includes a second source 21 connected to the first drain 12, a second drain 22 connected to the drain terminal 200, and a second gate 23 connected to the source terminal 100.

The semiconductor device of this embodiment serves as a normally-off transistor provided with the source terminal 100, the drain terminal 200, and the gate terminal 300 by the above-described configuration.

In the semiconductor device of this embodiment, the withstand voltage between the first source 11 and the first drain 12 when the normally-off transistor 10 is turned off is lower than the withstand voltage between the second source 21 and the second gate 23 of the normally-on transistor 20. Specifically, an avalanche breakdown voltage of the normally-off transistor 10 is designed to be lower than a withstand voltage of the gate insulation film of the normally-on transistor 20.

The avalanche breakdown voltage of the normally-off transistor 10 is specified by a withstand voltage of the parasitic body diode of the normally-off transistor 10 or a punchthrough withstand voltage of a channel unit. It is possible to adjust the avalanche breakdown voltage of the normally-off transistor 10 by adjusting impurity concentration and an impurity profile of an impurity layer forming the normally-off transistor 10, for example.

It is possible to directly estimate the avalanche breakdown voltage of the normally-off transistor 10 and the withstand voltage of the gate insulation film of the normally-on transistor 20 by putting a measuring needle on an electrode of the normally-off transistor 10 and that of the normally-on transistor 20, for example.

In a circuit configuration in which the normally-off transistor 10 and the normally-on transistor 20 are cascode connected, an overvoltage might be generated during device operation at a connection between the normally-off transistor 10 and the normally-on transistor 20 (hereinafter, also simply referred to as a connection), that is to say, the first drain 12 of the normally-off transistor 10 or the second source 21 of the normally-on transistor 20. The overvoltage might be generated by voltage dividing of a high voltage applied between the source terminal 100 and the drain terminal 200 at a parasitic capacitance ratio between the normally-off transistor 10 and the normally-on transistor 20 when the semiconductor device shifts from an on-state to an off-state, for example. Alternatively, this might be generated by the voltage dividing of the high voltage applied between the source terminal 100 and the drain terminal 200 at a leakage current ratio between the normally-off transistor 10 and the normally-on transistor 20 when the semiconductor device is turned off.

When the overvoltage is generated, a high voltage is applied between the second source 21 and the second gate 23 of the normally-on transistor 20. When the high voltage becomes equal to or higher than the withstand voltage of the gate insulation film, a leakage current of the gate insulation film of the normally-on transistor 20 might increase or the gate insulation film might be broken. When the leakage current of the gate insulation film of the normally-on transistor 20 increases or when the gate insulation film is broken, this brings operation failure of the semiconductor device. Therefore, reliability of the semiconductor device is deteriorated.

Even when the gate insulation film has no problem, since the over voltage is applied between the second source 21 and the second gate 23 of the normally-on transistor 20, a charge is trapped on a side of the second source 21. According to this, a current collapse might occur. When the current collapse occurs, an on-state current decreases and the operation failure arises. Therefore, the reliability of the semiconductor device is deteriorated.

In this embodiment, the avalanche breakdown voltage of the normally-off transistor 10 is designed to be lower than the withstand voltage of the gate insulation film of the normally-on transistor 20. According to this, the withstand voltage between the first source and the first drain when the normally-off transistor is turned off is made lower than the withstand voltage between the second source and the second gate of the normally-on transistor.

Therefore, even when the overvoltage is generated at the connection, an avalanche breakdown of the normally-off transistor 10 occurs, so that it is possible to release the charge at the connection. Therefore, it becomes possible to make the voltage applied between the second source 21 and the second gate 23 of the normally-on transistor 20 lower than the withstand voltage of the gate insulation film of the normally-on transistor 20. Therefore, an increase in the leakage current of the gate insulation film of the normally-on transistor 20 and a break of the gate insulation film are prevented. The current collapse is also prevented. Therefore, the reliability of the semiconductor device is improved.

Meanwhile, the withstand voltage of the gate insulation film of the normally-on transistor 20 is higher than 30 V in general. Therefore, the avalanche breakdown voltage of the normally-off transistor 10 is desirably not higher than 30 V.

The avalanche breakdown voltage is desirably sufficiently higher than an absolute value of a threshold (Vth) of the normally-on transistor 20. This is for surely turning off the normally-on transistor 20. From this point of view, the avalanche breakdown voltage of the normally-off transistor 10 is desirably not lower than an absolute value of the threshold (Vth) of the normally-on transistor 20+5 V. If Vth=−10 V is satisfied, the avalanche breakdown voltage of the normally-off transistor 10 is desirably not lower than 15 V.

A product of an on-resistance and a rated current of the normally-off transistor 10 is desirably not higher than 2 V. If the product is 2 V or so, it is possible to sufficiently inhibit a decrease in gate bias of the normally-on transistor 20 by a voltage drop occurring in the normally-off transistor 10. Therefore, current loss due to the decrease in the gate bias may be minimized.

Second Embodiment

A semiconductor device of this embodiment is different from that of the first embodiment in that a Zener diode including a first anode connected to a first source and a first cathode connected to a first drain and a second source having a Zener voltage lower than an avalanche breakdown voltage of a normally-off transistor is further provided. The description of contents overlapped with those of the first embodiment is not repeated.

Figure 2:
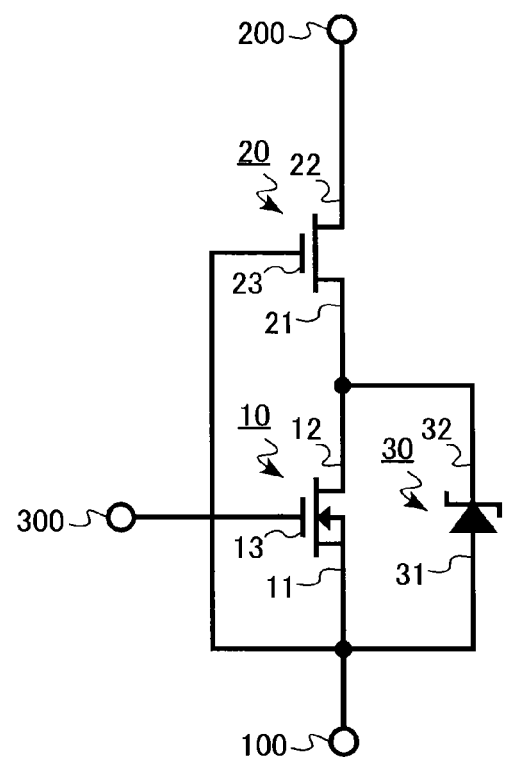
FIG. 2 is a circuit diagram of a semiconductor device of a second embodiment.

FIG. 2 is a circuit diagram of the semiconductor device of this embodiment. In the semiconductor device of this embodiment, a Zener diode 30 is provided in parallel with a normally-off transistor 10.

The Zener diode 30 includes a first anode 31 and a first cathode 32. The first anode 31 is connected to a first source 11. The first cathode 32 is connected to a first drain 12 and a second source 21.

The Zener voltage of the Zener diode 30 is set to be lower than the avalanche breakdown voltage of the normally-off transistor 10. The Zener voltage is also set to be lower than a withstand voltage of a gate insulation film of a normally-on transistor 20. According to this, a withstand voltage between the first source 11 and the first drain 12 when the normally-off transistor 10 is turned off becomes lower than a withstand voltage between the second source 21 and a second gate 23 of the normally-on transistor 20.

In the semiconductor device of this embodiment, when an overvoltage is generated at a connection between the normally-off transistor 10 and the normally-on transistor 20, a charge is released to the Zener diode 30 to pass through the source terminal 100 when the overvoltage reaches the Zener voltage. Therefore, an increase in voltage at the connection is inhibited and an increase in leakage current of the gate insulation film of the normally-on transistor 20 and a break of the gate insulation film are prevented. A current collapse is also prevented. Therefore, reliability of the semiconductor device is improved.

The Zener voltage of the Zener diode 30 may be controlled with higher accuracy as compared to the avalanche breakdown voltage of the normally-off transistor 10. Therefore, in the semiconductor device of this embodiment, it becomes possible to inhibit the overvoltage at the connection in a more stable manner than in the first embodiment by using the Zener diode 30. Even when an unexpected high voltage such as noise is applied to the first drain 12 of the normally-off transistor 10, the charge may be released by the Zener diode 30, so that this also contributes to protect the normally-off transistor 10.

Third Embodiment

A semiconductor device of this embodiment is different from that of the second embodiment in that a diode including a second anode connected to a first drain and a second source and a second cathode connected to a first cathode provided between the first drain and the second source, and a Zener diode and a capacitor provided between the first cathode and the second cathode, and a first source in parallel with the Zener diode are further provided. The description of contents overlapped with those of the second embodiment is not repeated.

Figure 3:
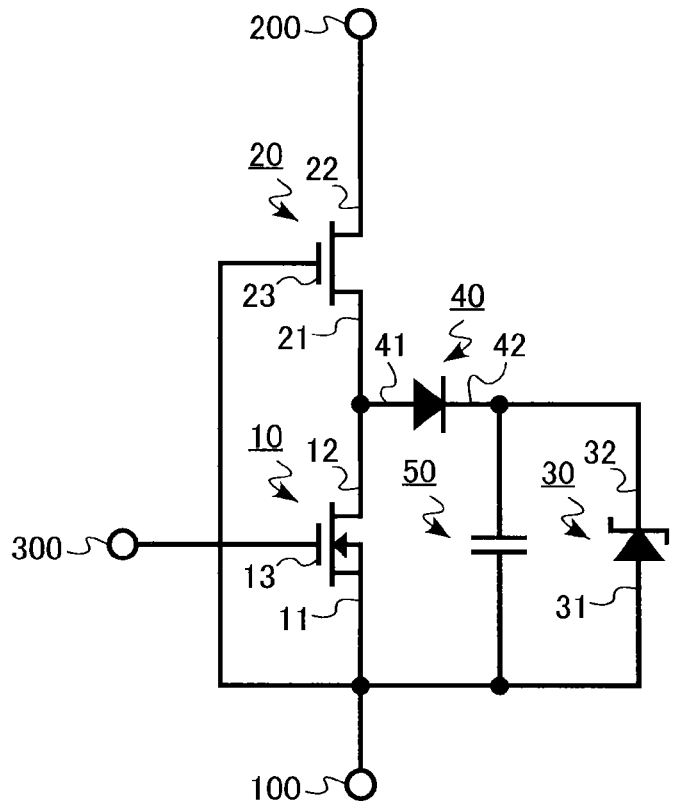
FIG. 3 is a circuit diagram of a semiconductor device of a third embodiment.

FIG. 3 is a circuit diagram of the semiconductor device of this embodiment. In the semiconductor device of this embodiment, a diode 40 is provided on a side of a drain of a normally-off transistor 10. A Zener diode 30 is provided in parallel with the normally-off transistor 10. Further, a capacitor 50 is provided in parallel with the Zener diode 30.

The diode 40 is provided between a first drain 12 and a second source 21, and the Zener diode 30. The diode 40 includes a second anode 41 and a second cathode 42. The second anode is connected to the first drain 12 and the second source 21. The second cathode 42 is connected to a first cathode 32.

The capacitor 50 is provided between the first cathode 32 and the second cathode 42, and a first source 11 in parallel with the Zener diode 30.

The diode 40 prevents backflow of a charge from a side of the capacitor 50. The diode 40 is a PiN diode or a Schottky barrier diode, for example.

According to this embodiment, when an overvoltage is generated at a connection between the normally-off transistor 10 and a normally-on transistor 20, the charge is temporarily accumulated in the capacitor 50. Then, the accumulated charge is released to a side of a source terminal 100 by the Zener diode 30. According to this, an increase in voltage at the connection is inhibited and an increase in leakage current of a gate insulation film of the normally-on transistor 20 and a break of the gate insulation film are prevented. A current collapse is also prevented. Therefore, reliability of the semiconductor device is improved.

In this embodiment, since the charge is temporarily accumulated in the capacitor 50, the Zener diode 30 may be an inexpensive diode having a small parasitic capacitance. Therefore, an inexpensive semiconductor device may be realized.

A capacitance of the capacitor 50 is connected in series to a capacitance of the diode 40 between the first source 11 and the first drain 12 of the normally-off transistor 10. A type having a parasitic capacitance significantly smaller than that of the Zener diode 30 may be selected as the diode 40 for a current required for absorbing the charge. Therefore, the capacitance of the capacitor 50 contributes little as a parasitic capacitance of the normally-off transistor 10 by making the capacitance of the diode 40 sufficiently smaller than the capacitance of the capacitor 50. Therefore, a decrease in operation speed of the normally-off transistor 10 and an increase in loss due to an increase in the parasitic capacitance may be inhibited.

Fourth Embodiment

In a semiconductor device of this embodiment, a normally-on transistor includes a gate field plate (hereinafter, also referred to as GFP). Other configuration is similar to that of the first embodiment. Therefore, the description of contents overlapped with those of the first embodiment is not repeated.

Figure 4:
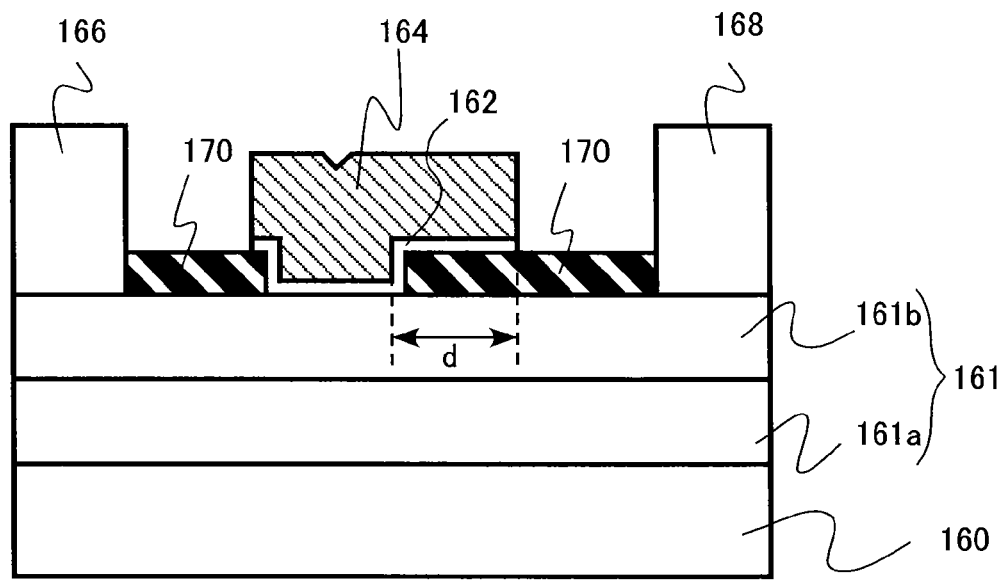
FIG. 4 is a schematic cross-sectional view of a normally-on transistor of a fourth embodiment.

FIG. 4 is a schematic cross-sectional view of the normally-on transistor of this embodiment. The normally-on transistor is a GaN (gallium nitride)-based HEMT provided with a gate insulation film.

A normally-on transistor 20 (FIG. 1) is formed on a nitride semiconductor layer 161 on a substrate 160. The substrate 160 is formed of silicon (Si), for example.

A buffer layer (not illustrated) is provided between the substrate 160 and the nitride semiconductor layer 161. The buffer layer serves to reduce lattice mismatch between the substrate 160 and the nitride semiconductor layer 161. The buffer layer is formed of a multi-layer structure of aluminum gallium nitride ($Al_xGa_{1-x}N$ (0<x<1)), for example.

The nitride semiconductor layer 161 is provided with a laminated structure of an operation layer (channel layer) 161*a* and a barrier layer (electron supply layer) 161*b*. The operation layer 161*a* is formed of gallium nitride (GaN), for example, and the barrier layer 161*b* is formed of aluminum gallium nitride (AlGaN), for example.

A heterojunction interface is formed between the operation layer 161*a* and the barrier layer 161*b*.

A gate electrode 164 is formed on the nitride semiconductor layer 161 with a first silicon nitride film 162 interposed therebetween. The first silicon nitride film 162 serves as a gate insulation film. The gate electrode 164 is, for example, a metal electrode. The metal electrode is, for example, a nickel (Ni) electrode, a titanium (Ti) electrode, or an aluminum (Al) electrode.

A source electrode 166 and a drain electrode 168 are provided on the nitride semiconductor layer 161 with the gate electrode 164 interposed therebetween. Each of the source electrode 166 and the drain electrode 168 is separated from the gate electrode 164.

A second silicon nitride film 170 is formed between the source electrode 166 and the gate electrode 164 and between the drain electrode 168 and the gate electrode 164 on the nitride semiconductor layer 161. The second silicon nitride film 170 is formed so as to be in contact with a surface of the nitride semiconductor layer 161. The second silicon nitride film 170 serves as a surface protection film (or a passivation film) which protects the surface of the nitride semiconductor layer 161 between the gate electrode 164 and the source electrode 166 and between the gate electrode 164 and the drain electrode 168.

The gate electrode 164 extends to a side of the drain electrode 168 on the second silicon nitride film 170. A part extended to the drain electrode 168 side of the gate electrode 164 serves as so-called the gate field plate. Meanwhile, a length (d in the drawing) of the part extended to the drain electrode 168 side of the gate electrode 164, that is to say, the part extended to the drain electrode 168 side from a lower end on the drain electrode 168 side of the gate electrode 164 is not shorter than 1 μm.

The gate field plate serves to reduce an electric field in a drain region between the gate electrode 164 and the drain electrode 168 to inhibit a current collapse. There is a source field plate (hereinafter, also referred to as SFP) obtained by extending the source electrode 166 to the drain electrode 168 side as a structure to provide a similar function.

Figure 5:
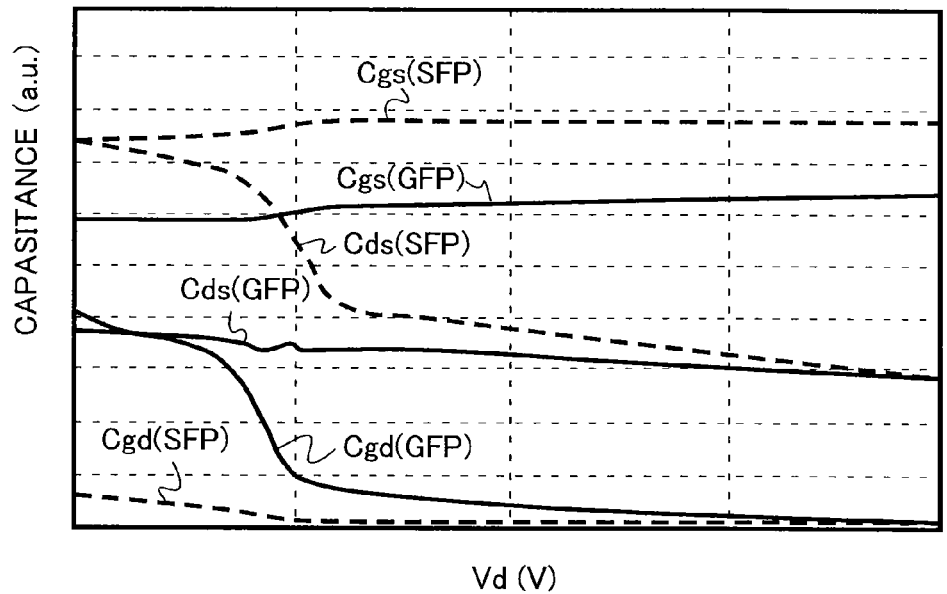
FIG. 5 is a view illustrating parasitic capacitances of a GFP and a SFP.

FIG. 5 is a view illustrating parasitic capacitances of the GFP and the SFP. A source-drain capacitance (Cds), a source-gate capacitance (Cgs), and a drain-gate capacitance (Cgd) of the GFP and those of the SFP are compared. A capacitance simulation result is illustrated. In the drawing, a solid line indicates the GFP and a dotted line indicates the SFP.

As is clear from FIG. 5, in the GFP, although the drain-gate capacitance (Cgd) is larger than that in the SFP, the source-drain capacitance (Cds) and the source-gate capacitance (Cgs) are smaller than those in the SFP.

In general, the parasitic capacitance of the transistor is desirably small from a viewpoint of avoiding a decrease in operation speed and an increase in loss. Especially, the drain-gate capacitance (Cgd) has a large effect on parasitic oscillation and a switching speed, so that this is desirably small.

In the semiconductor device of this embodiment, a second gate 23 of the normally-on transistor 20 is connected to a first source 11 of a normally-off transistor 10 as illustrated in the circuit diagram in FIG. 1. Transistor operation is performed by raising a voltage of a second source 21 of the normally-on transistor 20, so that charge/discharge of the second gate 23 is not directly performed during the operation. Therefore, it is possible to eliminate the effect of the drain-gate capacitance (Cgd) on the operation.

Therefore, in the semiconductor device of this embodiment, that is to say, in a configuration in which the normally-off transistor 10 and the normally-on transistor 20 are cascode connected, the GFP having small source-drain capacitance (Cds) and source-gate capacitance (Cgs) is desirable as a structure to realize a reduction in collapse as compared to the SFP.

According to this embodiment, in addition to an effect of improving reliability similar to that of the first embodiment, it becomes possible to inhibit the current collapse by inhibiting the effect of the parasitic capacitance on a device property by the GFP. Therefore, the semiconductor device with further improved reliability is realized.

Meanwhile, as for the GFP, although the structure in which the gate electrode itself extends to the drain side is described as an example, a configuration in which a GFP electrode having same potential as the gate electrode is provided on an upper layer and the like of the gate electrode separately from the gate electrode is also possible.

Fifth Embodiment

A semiconductor device of this embodiment is different from the semiconductor device of the second embodiment in that a Schottky barrier diode including a third anode connected to a first source and a third cathode connected to a first drain and a second source having a forward drop voltage lower than a forward drop voltage of a parasitic body diode of a normally-off transistor provided between the first drain and the second source, and the first source in parallel with a Zener diode is further provided. Hereinafter, the description of contents overlapped with those of the first and second embodiments is not repeated.

Figure 6:
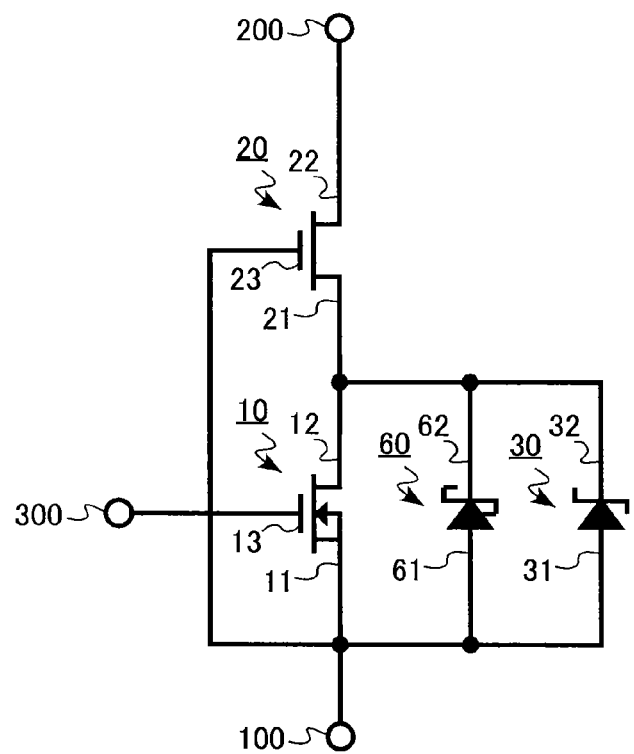
FIG. 6 is a circuit diagram of a semiconductor device of a fifth embodiment.

FIG. 6 is a circuit diagram of the semiconductor device of this embodiment. In the semiconductor device of this embodiment, a Zener diode 30 is provided in parallel with a normally-off transistor 10. Further, a Schottky barrier diode 60 is provided in parallel with the Zener diode 30.

The Schottky barrier diode 60 is provided with a third anode 61 and a third cathode 62. The third anode 61 is connected to a first source 11. The third cathode 62 is connected to a first drain 12 and a second source 21.

A forward drop voltage (Vf) of the Schottky barrier diode 60 is lower than a forward drop voltage (Vf) of the parasitic body diode (not illustrated) of the normally-off transistor. The Schottky barrier diode 60 is provided between the first drain 12 and the second source 21, and the first source 11 in parallel with the Zener diode 30.

When the Schottky barrier diode 60 is not provided, a current flows through the parasitic body diode of the normally-off transistor 10 in a reflux mode in which a source terminal 100 has a positive voltage relative to a drain terminal 200. In this embodiment, the Schottky barrier diode 60 having the forward drop voltage (Vf) lower than the forward drop voltage (Vf) of the parasitic body diode of the normally-off transistor 10 is provided. According to this, the current flows through the Schottky barrier diode 60 in the reflux mode.

Different from a PiN diode, the Schottky barrier diode operates by using only a majority carrier. Therefore, this is excellent in recovery property as compared to the PiN diode. Therefore, in addition to the effects of the first and second embodiments, it becomes possible to improve the recovery property in the reflux mode in this embodiment. Therefore, the semiconductor device excellent in reliability and recovery property may be realized. A normally-on transistor 20 bears a large part of a withstand voltage, so that a low withstand voltage type may be selected as the Schottky barrier diode 60. According to this, it is possible to realize high withstand voltage body diode operation with a Vf property and the recovery property similar to those of the low withstand voltage type.

Since the forward drop voltage (Vf) is small, it is also possible to reduce conduction loss and switching loss in the reflux mode. Application of an overvoltage at a connection is inhibited by a parasitic capacitance of the Schottky barrier diode 60. Since it is possible to release a charge from the connection by a leakage current of the Schottky barrier diode 60, the application of the overvoltage at the connection is inhibited. Therefore, the semiconductor device with further improved reliability is realized.

Meanwhile, since the Schottky barrier diode is not an avalanche-proof Schottky barrier diode, the withstand voltage of the Schottky barrier diode 60 is desirably higher than an avalanche breakdown voltage of the normally-off transistor 10.

Sixth Embodiment

A semiconductor device of this embodiment is further provided with a substrate, a source lead wire, a drain lead wire, and a gate lead wire. A normally-off transistor, a normally-on transistor, a Zener diode, and a Schottky barrier diode are mounted on the substrate. The Schottky barrier diode, the Zener diode, and the normally-on transistor are arranged in this order from a side of the source lead wire to a side of the drain lead wire. The normally-off transistor and the normally-on transistor are arranged in this order from the side of the source lead wire to the side of the drain lead wire. The source lead wire is connected to a third anode and a first source and the drain lead wire is connected to a second drain.

This embodiment is obtained by embodying the circuit configuration of the fifth embodiment as a power module. Hereinafter, the description of contents overlapped with those of the fifth embodiment is not repeated.

Figure 7:
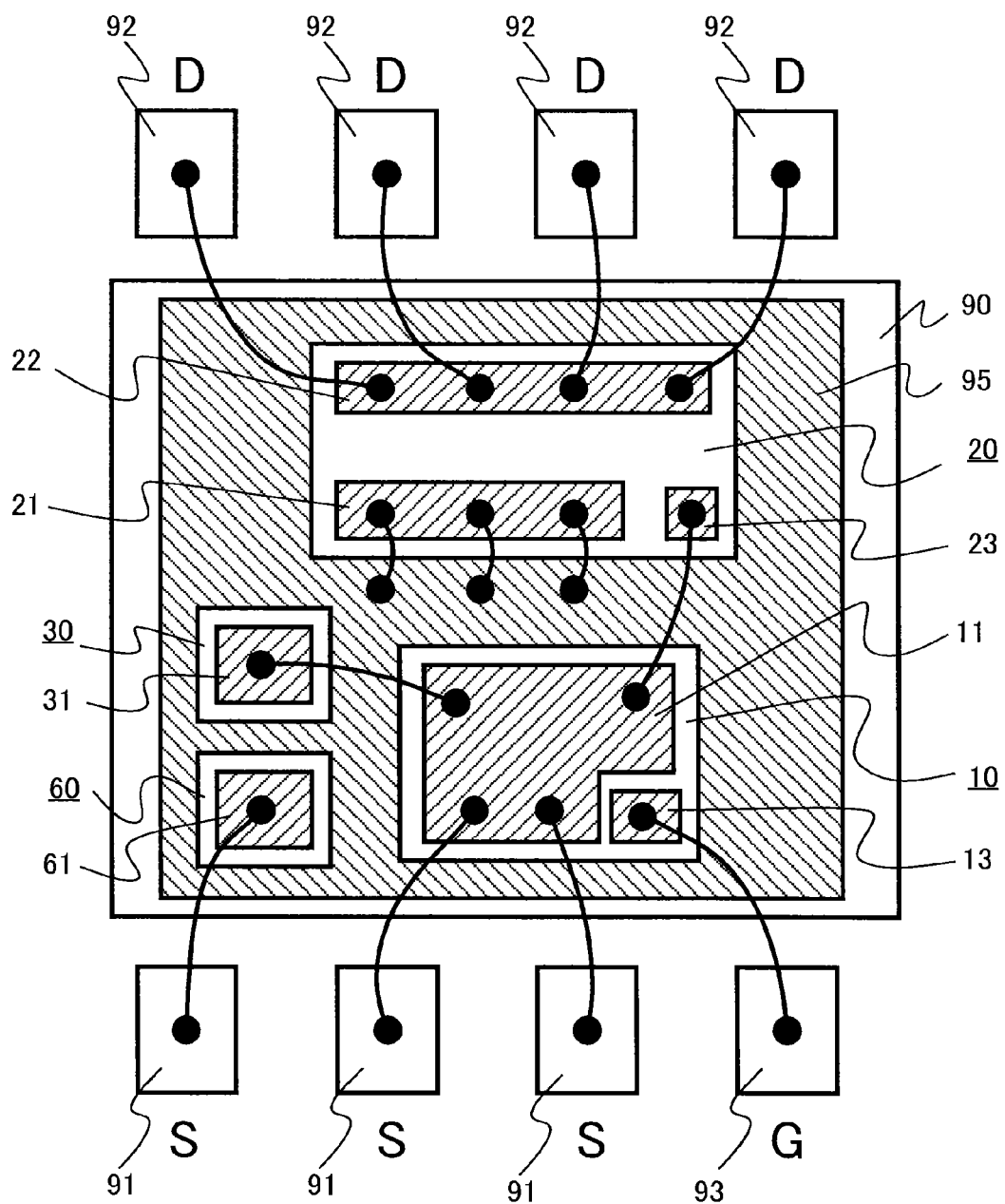
FIG. 7 is a top schematic view of a semiconductor device of a sixth embodiment.

FIG. 7 is a top schematic view of the semiconductor device of this embodiment.

The semiconductor device of this embodiment is provided with a substrate 90, a source lead wire 91, a drain lead wire 92, and a gate lead wire 93. The source lead wire 91, the drain lead wire 92, and the gate lead wire 93 correspond to a source terminal 100, a drain terminal 200, and a gate terminal 300, respectively.

A metal conductive material 95, for example, is present on at least a surface of the substrate 90. A normally-off transistor 10, a normally-on transistor 20, a Zener diode 30, and a Schottky barrier diode 60 are mounted on the substrate 90. Each of the normally-off transistor 10, the normally-on transistor 20, the Zener diode 30, and the Schottky barrier diode 60 is a semiconductor chip, for example, and is mounted on the conductive material 95 of the substrate with conductive paste and soldering, for example.

The Schottky barrier diode 60, the Zener diode 30, and the normally-on transistor 20 are arranged in this order from a side of the source lead wire 91 to a side of the drain lead wire 92. The normally-off transistor 10 and the normally-on transistor 20 are arranged in this order from the side of the source lead wire 91 to the side of the drain lead wire 92 on the substrate 90.

The source lead wire 91 is connected to a third anode 61 and a first source 11 and the drain lead wire 92 is connected to a second drain 22. Each connection is performed by wire bonding, for example. A material such as copper (Cu) and aluminum (Al) is used, for example, in the wire bonding.

According to this embodiment, the normally-off transistor 10 and the normally-on transistor 20 are arranged in this order from the side of the source lead wire 91 to the side of the drain lead wire 92. According to this, a pathway through which an on-state current flows of the semiconductor device may be shortened. This arrangement eliminates parasitic inductance of the pathway of the on-state current as far as possible to decrease conduction loss.

By arranging the Schottky barrier diode 60 and the normally-on transistor 20 in this order from the side of the source lead wire 91 to the side of the drain lead wire 92, it becomes possible to shorten the pathway of the current flowing through the pathway from the source lead wire 91 through the Schottky barrier diode 60 and the normally-on transistor 20 to the drain lead wire 92 in a reflux mode. Therefore, it becomes possible to decrease the conduction loss in the reflux mode.

In the Schottky barrier diode, a leakage current has large temperature dependency. The normally-on transistor 20 being a GaN-based HEMT emits heat the most in the semiconductor device of this embodiment. Therefore, it is possible to increase a distance between the Schottky barrier diode 60 and the normally-on transistor 20 by arranging the Zener diode 30 between the Schottky barrier diode 60 and the normally-on transistor 20. Therefore, property fluctuation of the Schottky barrier diode 60 may be inhibited.

The Zener diode 30 which inhibits an overvoltage at a connection is provided so as to be adjacent to the normally-off transistor 10 and the first source 11 and the first anode 31 are directly bonded. According to this, a pathway to release a charge from the connection becomes shorter and application of the overvoltage may be efficiently inhibited.

As described above, according to this embodiment, in addition to the effect of the fifth embodiment, it is possible to realize the semiconductor device excellent in property by appropriately arranging and connecting each device.

Seventh Embodiment

A semiconductor device of this embodiment is provided with a source terminal, a drain terminal, a gate terminal, a discharge terminal, a normally-off transistor including a first source connected to the source terminal, a first drain, and a first gate connected to the gate terminal, a normally-on transistor including a second source connected to the first drain, a second drain connected to the drain terminal, and a second gate connected to the source terminal, and a Zener diode including a first anode connected to the discharge terminal and a first cathode connected to the first drain and the second source having a Zener voltage lower than a withstand voltage between the second source and the second gate of the normally-on transistor and lower than an avalanche breakdown voltage of the normally-off transistor.

Figure 8:
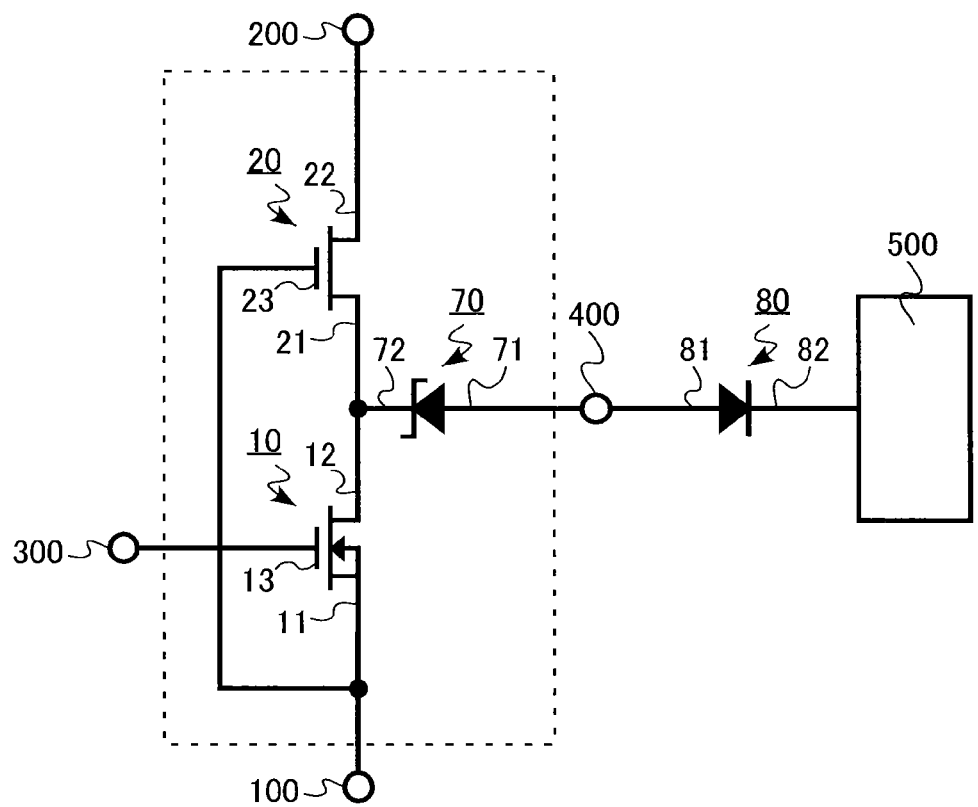
FIG. 8 is a circuit diagram of a semiconductor device of a seventh embodiment.

FIG. 8 is a circuit diagram of the semiconductor device of this embodiment. This is similar to that of the first embodiment in that a normally-off transistor 10 and a normally-on transistor 20 are cascode connected to form a power module. Hereinafter, the description of contents overlapped with those of the first embodiment is not repeated.

The semiconductor device of this embodiment is provided with a source terminal 100, a drain terminal 200, a gate terminal 300, and a discharge terminal 400. The normally-off transistor 10 includes a first source 11 connected to the source terminal 100, a first drain 12, and a first gate 13 connected to the gate terminal 300. The normally-on transistor 20 includes a second source 21 connected to the first drain 12, a second drain 22 connected to the drain terminal 200, and a second gate 23 connected to the source terminal 100.

A Zener diode 70 having the Zener voltage lower than the withstand voltage between the second source and the second gate of the normally-on transistor 20 is provided. The Zener voltage is also lower than the avalanche breakdown voltage of the normally-off transistor 10.

The Zener diode 70 includes a first anode 71 and a first cathode 72. The first anode 71 is connected to the discharge terminal 400. The first cathode 72 is connected to the first drain 12 and the second source 21.

A power source 500 is connected to the discharge terminal 400 through a diode 80. The second diode 80 includes a second anode 81 and a second cathode 82. The second diode 80 is a PiN diode, for example. The power source 500 is a power source of a control circuit which controls the cascode connected normally-off transistor 10 and normally-on transistor 20, for example.

The second anode 81 of the second diode 80 is connected to the discharge terminal 400. The second cathode 82 is connected to the power source 500. The diode 80 inhibits a current from flowing from a side of the power source 500 to a connection.

According to this embodiment, when an overvoltage is generated at the connection between the normally-off transistor 10 and the normally-on transistor 20, a charge is released to the Zener diode 70 to pass through the discharge terminal 400 when the overvoltage reaches the Zener voltage. Therefore, an increase in voltage at the connection is inhibited and an increase in leakage current of a gate insulation film of the normally-on transistor 20 and a break of the gate insulation film are prevented. A current collapse is also prevented. Therefore, reliability of the semiconductor device is improved. Since the charge generated at the connection by the overvoltage is put into the power source 500 for regeneration, energy saving of an entire system of the semiconductor device is realized.

Meanwhile, the Zener voltage is desirably optimized by a voltage of the power source 500 and a voltage value allowed at the connection. For example, when the voltage of the power source 500 is 5 V and the voltage allowed at the connection is 20 V, the Zener voltage may be adjusted to approximately 15 V.

Eighth Embodiment

A semiconductor device of this embodiment is provided with a substrate, a source lead wire, a drain lead wire, a gate lead wire, and a lead wire for discharge adjacent to the gate lead wire. A normally-off transistor, a normally-on transistor, and a Zener diode are mounted on the substrate. A first source is connected to the source lead wire, a second drain is connected to the drain lead wire, a first gate is connected to the gate lead wire, and a first anode is connected to the lead wire for discharge.

This embodiment is obtained by embodying the circuit configuration of the seventh embodiment as a power module on which a device is mounted. Hereinafter, the description of contents overlapped with those of the seventh embodiment is not repeated.

Figure 9:
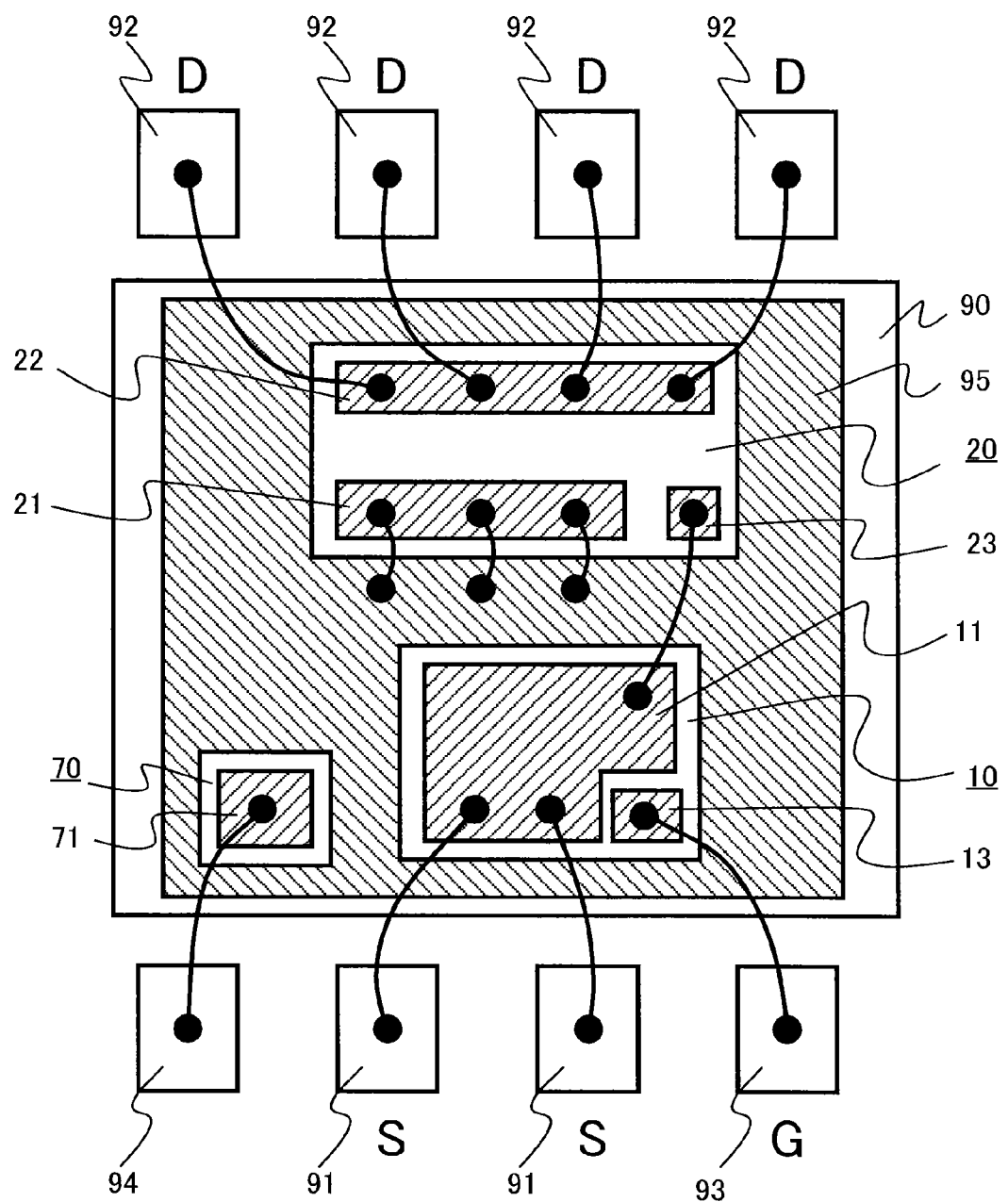
FIG. 9 is a top schematic view of a semiconductor device of an eighth embodiment.

FIG. 9 is a top schematic view of the semiconductor device of this embodiment. FIG. 9 illustrates a state in which devices in a dotted frame in FIG. 8 is mounted.

A source lead wire 91, a drain lead wire 92, a gate lead wire 93, a lead wire 94 for discharge adjacent to the source lead wire 91, and a substrate 90 are provided. A normally-off transistor 10, a normally-on transistor 20, and a Zener diode 70 are mounted on the substrate 90, a first source 11 is connected to the source lead wire 91, a second drain 22 is connected to the drain lead wire 92, a first gate 13 is connected to the gate lead wire 93, and a first anode 71 is connected to the lead wire 94 for discharge.

Figure 10:
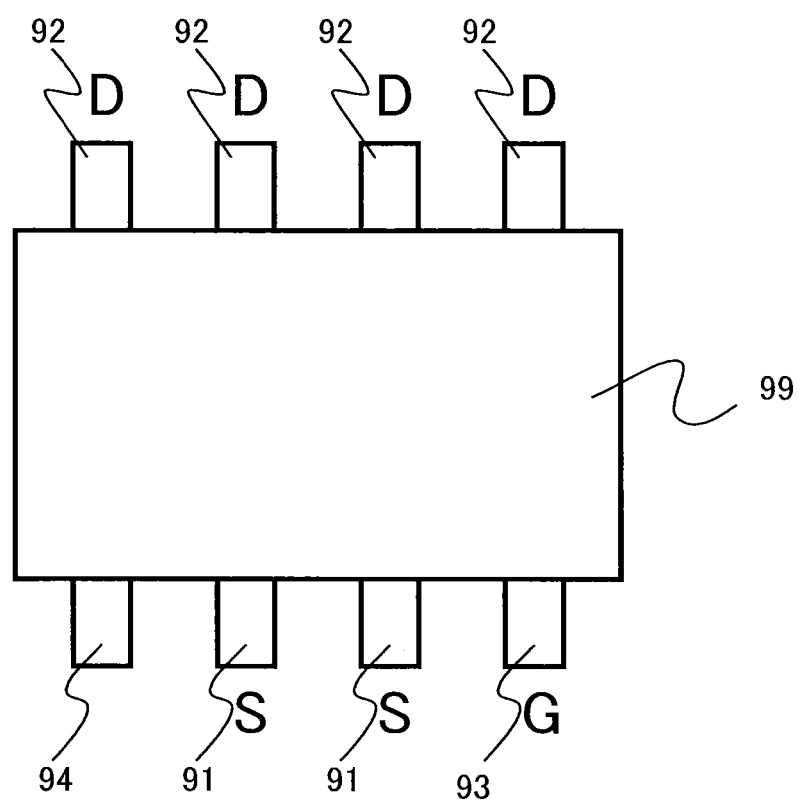
FIG. 10 is an external view of the semiconductor device of the eighth embodiment.

FIG. 10 is an external view of the semiconductor device of this embodiment. A state in which the power module illustrated in FIG. 9 is stored in one semiconductor package is illustrated.

The semiconductor package is formed of a sealing unit 99 formed of resin and the like, the source lead wire 91, the drain lead wire 92, the gate lead wire 93, and the lead wire 94 for discharge. The normally-off transistor 10, the normally-on transistor 20, and the Zener diode 70 are mounted in the sealing unit 99.

This embodiment is the semiconductor package in which the lead wire 94 for discharge is adjacent to the source lead wire 91. In the semiconductor package of this embodiment, when a charge generated by an overvoltage at a connection between the normally-off transistor 10 and the normally-on transistor 20 is wanted to be regenerated, the lead wire 94 for discharge may be connected to the power source 500 as illustrated in FIG. 8. On the other hand, when it is wanted to release the charge generated by the overvoltage at the connection to a side of the source terminal 100 as illustrated in the second embodiment, the lead wire 94 for discharge and the adjacent source lead wire 91 may be short-circuited.

According to this embodiment, it is possible to provide the semiconductor package capable of easily realizing an appropriate circuit configuration depending on intended usage.

Ninth Embodiment

A semiconductor device of this embodiment is similar to that of the seventh embodiment except that a diode including a second anode connected to a first anode and a second cathode connected to a discharge terminal is further provided between a Zener diode and the discharge terminal. Hereinafter, the description of contents overlapped with those of the seventh embodiment is not repeated.

Figure 11:
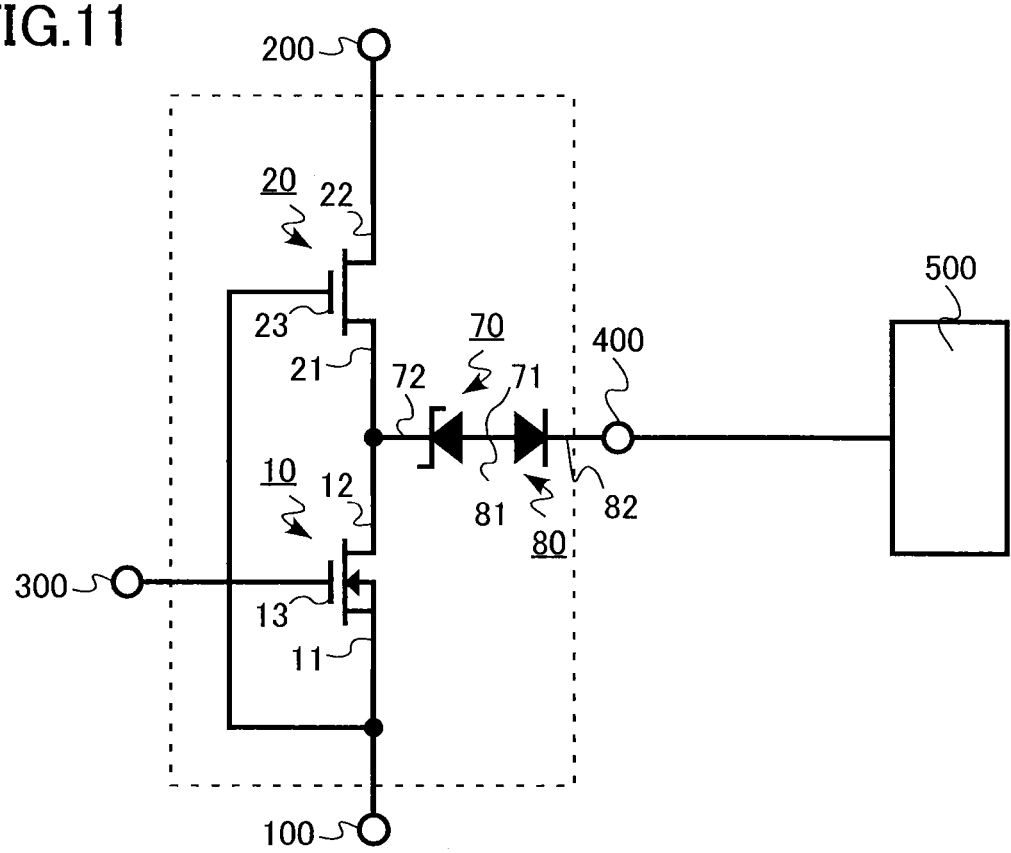
FIG. 11 is a circuit diagram of a semiconductor device of a ninth embodiment.

FIG. 11 is a circuit diagram of the semiconductor device of this embodiment.

Different from the seventh embodiment, in the semiconductor device of this embodiment, a diode 80 is provided between a discharge terminal 400 and a Zener diode 70. For example, devices in a dotted frame in FIG. 11 may be made one semiconductor package.

It is possible to obtain an effect similar to that of the seventh embodiment also by this embodiment. Additionally, by mounting the diode 80 for preventing backflow in the semiconductor package, it becomes possible to realize a more compact system.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a normally-off transistor having a first source connected to a source terminal, a first drain, and a first gate connected to a gate terminal;
   a normally-on transistor having a second source connected to the first drain, a second drain connected to a drain terminal, and a second gate connected to the source terminal;
   a Zener diode having a first anode connected to the first source and a first cathode connected to the first drain and the second source, the Zener diode having a Zener voltage lower than an avalanche breakdown voltage of the normally-off transistor;
   a diode provided between the first drain and the Zener diode, the diode having a second anode connected to the first drain and a second cathode connected to the first cathode; and
   a capacitor having a first end and a second end, the first end being connected to the first cathode and the second cathode, and the second end being connected to the first source and the first anode, the capacitor being provided in parallel with the Zener diode, wherein
   a withstand voltage between the first source and the first drain when the normally-off transistor is turned off is lower than the withstand voltage between the second source and the second gate of the normally-on transistor.

2. The device according to claim 1, wherein the normally-on transistor is a GaN-based HEMT.

3. The device according to claim 2, wherein the normally-on transistor has a gate field plate.

4. A semiconductor device, comprising:
a normally-off transistor having a first source connected to a source terminal, a first drain, and a first gate connected to a gate terminal;
a normally-on transistor having a second source connected to the first drain, a second drain connected to a drain terminal, and a second gate connected to the source terminal;
a Zener diode having a first anode connected to the first source and a first cathode connected to the first drain and the second source, the Zener diode having a Zener voltage lower than an avalanche breakdown voltage of the normally-off transistor; and
a Schottky barrier diode having a third anode connected to the first source and a third cathode connected to the first drain, the Schottky barrier diode having a forward drop voltage lower than a forward drop voltage of a parasitic body diode of the normally-off transistor, the parasitic body diode provided between the first drain and the first source in parallel with the Zener diode.

5. The device according to claim 4, further comprising
a substrate, a source lead wire, a drain lead wire, and a gate lead wire, wherein
the Schottky barrier diode, the Zener diode, and the normally-on transistor are arranged in this order on the substrate from a side of the source lead wire to a side of the drain lead wire,
the normally-off transistor and the normally-on transistor are arranged in this order from the side of the source lead wire to the side of the drain lead wire,
the source lead wire is connected to the third anode and the first source, and
the drain lead wire is connected to the second drain.

6. The device according to claim 1, wherein the normally-off transistor is a Si-vertical MOSFET.

7. A semiconductor device, comprising:
a source terminal;
a drain terminal;
a gate terminal;
a discharge terminal, the discharge terminal being separated from the source terminal, the drain terminal, and the gate terminal;
a normally-off transistor having a first source connected to the source terminal, a first drain, and a first gate connected to the gate terminal;
a normally-on transistor having a second source connected to the first drain, a second drain connected to the drain terminal, and a second gate connected to the source terminal, and
a Zener diode having a first anode connected to the discharge terminal and a first cathode connected to the first drain, the Zener diode having a Zener voltage lower than a withstand voltage between the second source and the second gate of the normally-on transistor and lower than an avalanche breakdown voltage of the normally-off transistor.

8. The device according to claim 7, further comprising a diode having a second anode connected to the first anode and a second cathode connected to the discharge terminal between the Zener diode and the discharge terminal.

9. The device according to claim 7, wherein the discharge terminal is connected to a power source.

10. The device according to claim 7, further comprising
a substrate, a source lead wire, a drain lead wire, a gate lead wire, and a lead wire for discharge adjacent to the gate lead wire,
wherein the normally-off transistor, the normally-on transistor, and the Zener diode are mounted on the substrate,
the first source is connected to the source lead wire,
the second drain is connected to the drain lead wire,
the first gate is connected to the gate lead wire, and
the first anode is connected to the lead wire for discharge.

11. The device according to claim 1, wherein the diode is a PiN diode or a Schottky barrier diode.

* * * * *